United States Patent
Kim et al.

(10) Patent No.: US 10,559,506 B2
(45) Date of Patent: Feb. 11, 2020

(54) METHOD OF INSPECTING SEMICONDUCTOR DEVICE

(71) Applicant: Samsung Electronics Co., Ltd., Suwon-si, Gyeonggi-do (KR)

(72) Inventors: Min Kook Kim, Goyang-si (KR); Jun Chul Kim, Seoul (KR); Myung Suk Um, Hwaseong-si (KR); Yu Sin Yang, Seoul (KR); Ye Ny Yim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/113,554

(22) Filed: Aug. 27, 2018

(65) Prior Publication Data

US 2019/0198404 A1    Jun. 27, 2019

(30) Foreign Application Priority Data

Dec. 26, 2017  (KR) ........................ 10-2017-0179655

(51) Int. Cl.
*H01L 21/66*  (2006.01)
*G01B 15/00*  (2006.01)
(Continued)

(52) U.S. Cl.
CPC .............. *H01L 22/12* (2013.01); *G01B 15/00* (2013.01); *G06T 7/001* (2013.01);
(Continued)

(58) Field of Classification Search
CPC .............. H01L 22/12; H01L 21/68764; H01L 21/2633; G06T 7/001; G06T 7/73; G06T 7/60; G06T 2207/10061; G06T 2207/30148; G06T 3/60; G06T 7/0006; G01B 15/00; G01B 2210/56
See application file for complete search history.

(56) References Cited

U.S. PATENT DOCUMENTS 6,028,363 A    2/2000 Lin
7,094,312 B2   8/2006 Libby et al.
(Continued)

OTHER PUBLICATIONS

Tsuneo Kanda, et al. "Alignment sensor corrections for tool-induced shift (TIS)," Proceedings of SPIE, SPIE vol. 3051, pp. 845-855, (2017).

*Primary Examiner* — Edward Chin
(74) *Attorney, Agent, or Firm* — Harness, Dickey & Pierce, P.L.C.

(57) ABSTRACT

A method of inspecting a semiconductor device including setting a target place on a wafer, the target place including a deep trench, forming a first cut surface by performing first milling on the target place in a first direction, obtaining first image data of the first cut surface, forming a second cut surface by performing second milling on the target place in a second direction opposite to the first direction, obtaining second image data of the second cut surface, obtaining a plurality of first critical dimension (CD) values for the deep trench from the first image data, obtaining a plurality of second CD values for the deep trench from the second image data, analyzing a degree of bending of the deep trench based on the first CD values and the second CD values, and providing the semiconductor device meeting a condition based on results of the analyzing may be provided.

20 Claims, 10 Drawing Sheets

(51) Int. Cl.
    *H01L 21/263*     (2006.01)
    *H01L 21/687*     (2006.01)
    *G06T 7/00*     (2017.01)
    *G06T 3/60*     (2006.01)
    *G06T 7/60*     (2017.01)
    *G06T 7/73*     (2017.01)

(52) U.S. Cl.
    CPC .... *H01L 21/2633* (2013.01); *H01L 21/68764* (2013.01); *G01B 2210/56* (2013.01); *G06T 3/60* (2013.01); *G06T 7/60* (2013.01); *G06T 7/73* (2017.01); *G06T 2207/10061* (2013.01); *G06T 2207/30148* (2013.01)

(56) References Cited

U.S. PATENT DOCUMENTS

| | | |
|---|---|---|
| 8,198,603 B2 | 6/2012 | Takahashi et al. |
| 8,624,185 B2 | 1/2014 | Maas et al. |
| 8,860,941 B2 | 10/2014 | Lee et al. |
| 8,890,064 B2 | 11/2014 | Arjavac et al. |
| 9,279,752 B2 | 3/2016 | Moriarty et al. |
| 9,412,560 B2 * | 8/2016 | Stone ................ G01N 23/2255 |
| 9,466,537 B2 * | 10/2016 | Kim ..................... H01L 22/12 |
| 9,741,536 B2 | 8/2017 | Lee et al. |
| 2006/0076511 A1 | 4/2006 | Borden et al. |
| 2013/0319849 A1 * | 12/2013 | Fuller ................ H01J 37/3026 |
| | | 204/192.34 |

\* cited by examiner

METHOD OF INSPECTING SEMICONDUCTOR DEVICE

This application claims priority under 35 U.S.C. § 119 to Korean Patent Application No. 10-2017-0179655, filed on Dec. 26, 2017, in the Korean Intellectual Property Office, the disclosure of which is incorporated herein in its entirety by reference.

BACKGROUND

1. Field

The present disclosure relates to methods of inspecting a semiconductor device, and more particularly, to methods of inspecting and analyzing a structure of a semiconductor device formed on a wafer.

2. Description of the Related Art

A semiconductor device includes a plurality of fine patterns formed by various manufacturing processes. Various inspection techniques using vertical scanning electron microscope (VSEM) and transmission electron microscope (TEM) have been used to analyze or interpret a structure (e.g., vertical structure) of fine patterns.

However, such techniques are experiencing challenges in preparing a stable sample for precisely analyzing the structure of fine patterns of a semiconductor device such as a vertical NAND (V-NAND) memory cell used in a memory device with increasingly high capacity and high integration density. Thus, these techniques may not be sufficiently reliable as desired. Further, it may be difficult to compensate for an error that occurs while inspecting a sample with these techniques.

SUMMARY

Aspects of the disclosure provide methods of inspecting a semiconductor device that is capable of analyzing structures of various fine patterns of a semiconductor device with improved accuracy.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a method of inspecting a semiconductor device includes setting at least one target place on a wafer, the target place including at least one deep trench, forming a first cut surface by performing first milling on the target place in a first direction, obtaining first image data of the first cut surface, forming a second cut surface by performing second milling on the target place in a second direction opposite to the first direction, obtaining second image data of the second cut surface, obtaining a plurality of first critical dimension (CD) values for the deep trench from the first image data, obtaining a plurality of second CD values for the deep trench from the second image data, analyzing a degree of bending of the deep trench based on the plurality of first CD values and the plurality of second CD values, and providing the semiconductor device meeting a condition based on results of the analyzing.

According to another aspect of the disclosure, a method of inspecting a semiconductor device includes loading a wafer onto a stage of an inspection device, the wafer including at least one deep trench, forming a first cut surface by performing first milling on the wafer in a first direction, first-rotating the stage by a first angle subsequent to the forming a first cut surface, performing rock-milling in a second direction, the second direction being at an angle to the first direction, subsequent to the first-rotating the stage, obtaining first image data by taking an SEM photograph of the first cut surface in the first direction, second-rotating the stage by 180 degrees, forming a second cut surface by performing second milling in a third direction opposite to the first direction subsequent to the second-rotating the stage, performing rock-milling in a fourth direction, the fourth direction being at an angle to the third direction, subsequent to the second-rotating the stage, obtaining second image data by taking an SEM photograph of the second cut surface in the third direction, analyzing a degree of bending of the deep trench based on the first image data and the second image data, and providing the semiconductor device meeting a condition based on results of the analyzing.

According to another aspect of the disclosure, a method of inspecting a semiconductor device includes setting at least one target place on a wafer, the target place including at least one deep trench, obtaining first image data of a first cut surface of the target place in a first direction, obtaining second image data of a second cut surface of the target place in a second direction, the second direction being opposite to the first direction, obtaining a first CD value for a width of a cross-section of the deep trench in the first cut surface and a position of a first center point of the cross-section of the deep trench in the first cut surface, the first CD value and the position of the first center point being values measured in a horizontal direction that is perpendicular to a depth direction of the deep trench, obtaining a second CD value for a width of a cross-section of the deep trench in the second cut surface and a position of a second center point of the cross-section of the deep trench in the second cut surface, the second CD value and the position of the second center point being values measured in the horizontal direction, analyzing a degree of bending of the deep trench based on the first CD value, the second CD value, and providing the semiconductor device meeting a condition based on results of the analyzing.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
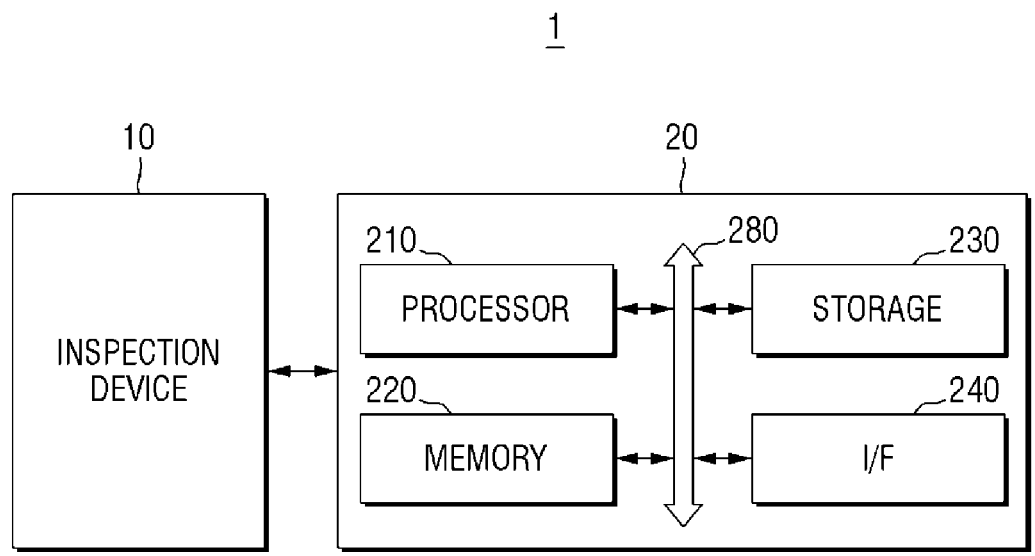
FIG. 1 is a block diagram of a system for inspecting a semiconductor device according to an example embodiment.

FIG. 1 is a block diagram of a system 1 for inspecting a semiconductor device according to an example embodiment.

Referring to FIG. 1, the system 1 for inspecting a semiconductor device according to the example embodiment includes an inspection device 10 and a computing system 20.

The inspection device 10 inspects fine patterns constituting a semiconductor device and transmits the inspection result to the computing system 20. For example, the inspection device 10 may inspect the vertical structure of deep trenches of vertical NAND (V-NAND) memory cells that constitute a memory device and transmit the inspection result to the computing system 20. However, example embodiments are not limited thereto. In some example embodiments, the inspection device 10 may inspect various structures of various patterns constituting a semiconductor device.

In some example embodiments, the inspection device 10 may perform milling on a wafer 100 (see FIG. 2) having semiconductor devices, irradiate an electron beam to a cut surface formed by the milling so as to obtain image data of the cut surface, and transmit the image data to the computing system 20.

The inspection device 10 will be described in more detail later with reference to FIG. 2.

The computing system 20 receives image data of fine patterns of a semiconductor device from the inspection device 10 and performs a series of operations on the image data to determine whether the structure of the fine patterns meets process conditions for manufacturing a semiconductor device and/or other conditions for producing a semiconductor device.

For example, the inspection system 1 according to various example embodiments may determine whether the structure of fine patterns of a V-NAND memory cell is suitable for performing, for example, a desired (or alternatively, predetermined) etching process.

In an example, because a V-NAND memory cell is thicker than a conventional NAND memory cell, the etch profile of a stack structure of the V-NAND memory cell needs to be precisely inspected in order to perform a precise etching process. In this case, the inspection system 1 according to some example embodiments may analyze, for example, the vertical structure of a deep trench of the V-NAND memory cell, and generate and provide feedback data relating to process conditions so that an etching process used to form the deep trench can be performed in a more stable manner.

Further, such feedback data can be used to improve the yield of products loaded with the V-NAND memory.

In some example embodiments, the computing system 20 may be a computing device such as a personal computer, a server, a notebook computer, a tablet computer, a smart phone, or a cellular phone.

In the current example embodiment, the computing system 20 may include a processor 210, a memory 220, a storage 230, and an interface 240. The processor 210, the memory 220, the storage 230, and the interface 240 may be electrically connected to a bus 280 to exchange data with each other.

The processor 210 may execute an application or program for processing image data of fine patterns of a semiconductor device received from the inspection device 10.

The memory 220 may be used as a main memory for the operation of the processor 210 or a cache memory for temporarily storing data. In some example embodiments, the memory 220 may include a volatile memory such as a static random access memory (SRAM) or a dynamic random access memory (DRAM).

The storage 230 may store data desired for the processor 210 to execute an application or program for processing image data of fine patterns of a semiconductor device. In some example embodiments, the storage 230 may be implemented as a hard disk drive (HDD), a solid state drive (SSD), or a memory card.

The interface 240 provides an environment for exchanging data between the inspection device 10 and the computing system 20. In some example embodiments, the interface 240 may support data communication between the inspection device 10 and the computing system 20 in a wireless or wired environment.

Figure 2:
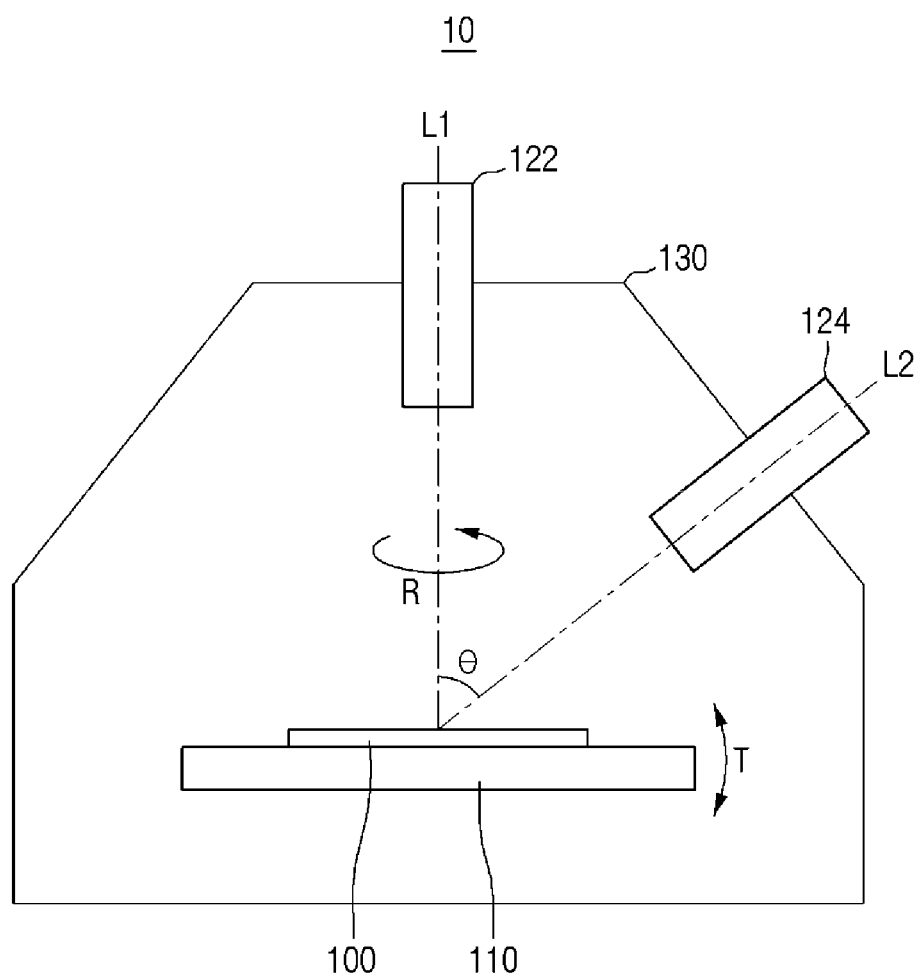
FIG. 2 is a schematic diagram of a device for inspecting a semiconductor device according to an example embodiment.

FIG. 2 is a schematic diagram of a device 10 for inspecting a semiconductor device according to an example embodiment.

Referring to FIG. 2, the device 10 for inspecting a semiconductor device according to the example embodiment includes a stage 110, an image capturing unit 122, and a milling unit 124. However, this configuration is merely an example used for ease of description, and the scope of example embodiments is not limited to this configuration.

A wafer 100 may be loaded onto an upper surface of the stage 110. The stage 110 may tilt or rotate the wafer 100 according to operations of the image capturing unit 122 and/or the milling unit 124. For example, the stage 110 may tilt the wafer 100 along a T direction and rotate the wafer 100 along an R direction. Further, the stage 110 may move the wafer 100 in a horizontal direction so that milling and image capturing can be performed on a number of places on the wafer 100.

The image capturing unit 122 may irradiate an electronic beam to a region of the wafer 100 to obtain image data of the region. For example, the image capturing unit 122 may irradiate an electron beam to a cut surface formed by the milling unit 124 to obtain image data of the cut surface, and then transmit the obtained image data to the computing system 20.

In some example embodiments, the image capturing unit 122 may be a scanning electron microscope (SEM).

The milling unit 124 performs milling for forming cut surfaces at one or more positions of fine patterns existing in a desired (or alternatively, predetermined) target place on the wafer 100 by, for example, irradiating a focused ion beam to the target place.

In some example embodiments, the milling unit 124 may use focused ion beam (FIB) technology.

The image capturing unit 122 and the milling unit 124 may be coupled to a vacuum chamber 130 to be placed above the stage 110. For example, the milling unit 124 may be inclined at a desired (or alternatively, predetermined) angle θ with respect to the image capturing unit 122. The desired (or alternatively, predetermined) angle θ may be an angle formed by a central axis L1 of the image capturing unit 122 and a central axis L2 of the milling unit 124 in FIG. 2. In the current example embodiment, the desired (or alternatively, predetermined) angle θ may be set to an acute angle.

Hereinafter, methods of inspecting a semiconductor device according to some example embodiments will be described in detail based on the inspection system 1 described above with reference to FIGS. 1 and 2. However, it will be apparent to those skilled in the art that the inspection system 1 performing methods of inspecting a semiconductor device according to the various example embodiments disclosed herein below can be modified or changed as desired.

Figure 3:
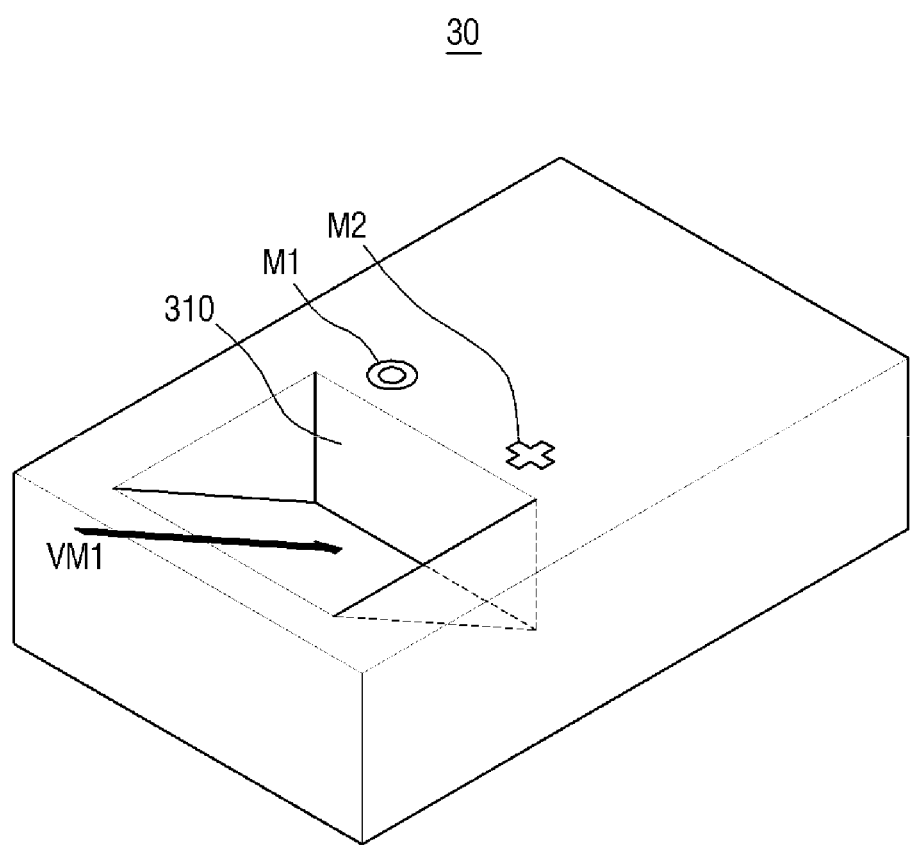
FIG. 3 is a diagram illustrating a process of forming an analysis region for a target place for inspecting a semiconductor device according to an example embodiment.

FIG. 3 is a diagram illustrating a process of forming an analysis region for a target place for inspecting a semiconductor device according to an example embodiment.

Referring to FIG. 3, in the method of inspecting a semiconductor device according to the example embodiment, at least one target place 30 may be set on a wafer 100.

In various example embodiments, the target place 30 may include various fine patterns of a semiconductor device. However, to clearly describe the spirit of example embodiments, it will hereinafter be assumed that the target place 30 includes one or more deep trenches formed in a V-NAND memory cell and that the deep trenches are inspected. However, example embodiments are not limited to this case.

The device 10 for inspecting a semiconductor device according to the example embodiment may form a first cut surface 310 by performing first milling VM1 on the target place 30 in a first direction, and obtain first age data of the first cut surface 310.

For example, the inspection device 10 may align the wafer 100 loaded onto the stage 110, and then prove the stage 110 to inspect the target place 30 on the wafer 100. For example, the inspection device 10 may horizontally move the stage 110 to inspect the target place 30 on the wafer 100.

Next, the inspection device 10 may perform the first milling VM1 on the target place 30 in the first direction.

For example, the inspection device 10 may per the first milling VM1 in the first direction after setting a tilting angle to, for example, 52 degrees. Here, the first milling VM1 may refer to a FIB vertical milling.

Next, after forming the first cut surface 310 by perform g the first milling VM1, inspection device 10 may perform rock-milling in a third direction that is at a certain angle to the first direction.

For example, the inspection device 10 may rotate the stage 110 by a first angle, for example, 90 degrees, and then perform rock-milling in the third direction that is at the certain angle to the first direction. Here, the tilting angle may be set to, for example, 30 degrees. The rock-milling refers to a process of breaking solid materials into smaller pieces by grinding or crushing.

One important issue of a conventional milling process using FIB is known as the curtain effect. Materials with different milling behavior above the region of interest result in different sample thicknesses below. Such milling artifact can make detailed analysis of the structures difficult or even impossible. The curtain effect is created by spatial variation of the sputter rate of the specimen and the modulation of the current density by forward scattering of the ions. The rock-milling may be performed to reduce the so-called "curtain effect" due to a difference in etching rates associated a change in thicknesses of patterns on a structure while performing a conventional milling process.

Next, the inspection device 10 may obtain the first image data of the first cut surface 310.

For example, the inspection device 10 may rotate the stale 110 in reverse by the first angle, for example, 90 degrees, and then obtain SEM image data of the first cut surface 310 in the first direction. Here, the tilting angle may be set again to, for example, 52 degrees.

Therefore, the inspection device 10 can obtain the first image data including information about cross-sections of one or more deep trenches formed in the first cut surface 310 and transmit the first image data to the computing system 20.

In the current example embodiment, a first marker M1 for identifying a reference position may be used by the inspection device 10 to align, tilt, and rotate the wafer 100.

Figure 4:
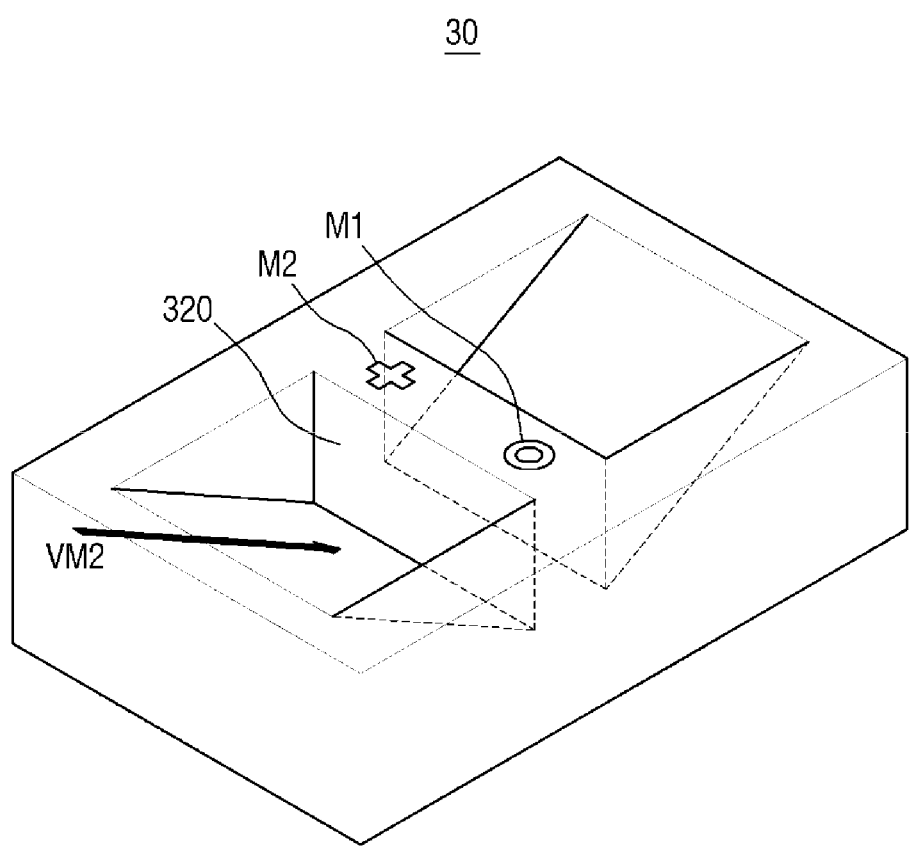
FIG. 4 is a diagram illustrating a process of forming an analysis region for a target place for inspecting a semiconductor device according to an example embodiment.

FIG. 4 is a diagram illustrating a process of forming an analysis region for a target place for inspecting a semiconductor device according to an example embodiment.

Referring to FIG. 4, the device 10 for inspecting a semiconductor device according to the example embodiment forms a second cut surface 320 by performing second milling VM2 on the target place 30 in a second direction, and obtains second image data of the second cut surface 320. Here, the second direction may be the opposite direction of the first direction.

For example, the inspection device 10 may rotate the wafer 100 by 180 degrees. That is, the inspection device 10 may rotate the wafer 100 by 180 degrees after obtaining the first image data of the first cut surface 310 and before forming the second cut surface 320.

Next, the inspection device 10 may perform the second milling VM2 on the target place 30 in the second direction.

For example, the inspection device 10 may perform the second milling VM2 in the second direction after setting the tilting angle to, for example, 52 degrees. Here, the second milling VM2 may refer to a FIB vertical milling.

Next, after forming the second cut surface 320 by performing the second milling VM2, the inspection device 10 may perform rock-milling in a fourth direction that is at a certain angle to the second direction.

For example, the inspection device 10 may rotate the stage 110 by the first angle, for example, 90 degrees, and then perform the rock-milling in the fourth direction that is at the first angle to the second direction. Here, the tilting angle may be set to, for example, 30 degrees.

As described above, the rock-milling may be performed to reduce the so-called "curtain effect" due to, for example, a difference in etching rates associated with a change in thicknesses of patterns on a structure while performing a conventional milling process.

Next, the inspection device 10 obtains the second image data of the second cut surface 320.

For example, the inspection device 10 may rotate the stage 110 in reverse by the first angle, for example, 90 degrees, and then obtain SEM image data of the second cut surface 320 in the second direction. Here, the tilting angle may be set again to, for example, 52 degrees.

Therefore, the inspection device 10 can obtain the second image data including information about cross-sections of one or more deep trenches exposed at the second cut surface 320, and transmit the second image data to the computing system 20.

In the current example embodiment, a second marker M2 for identifying a reference position may be used by the inspection device 10 to align, tilt, and rotate the wafer 100.

Figure 5:
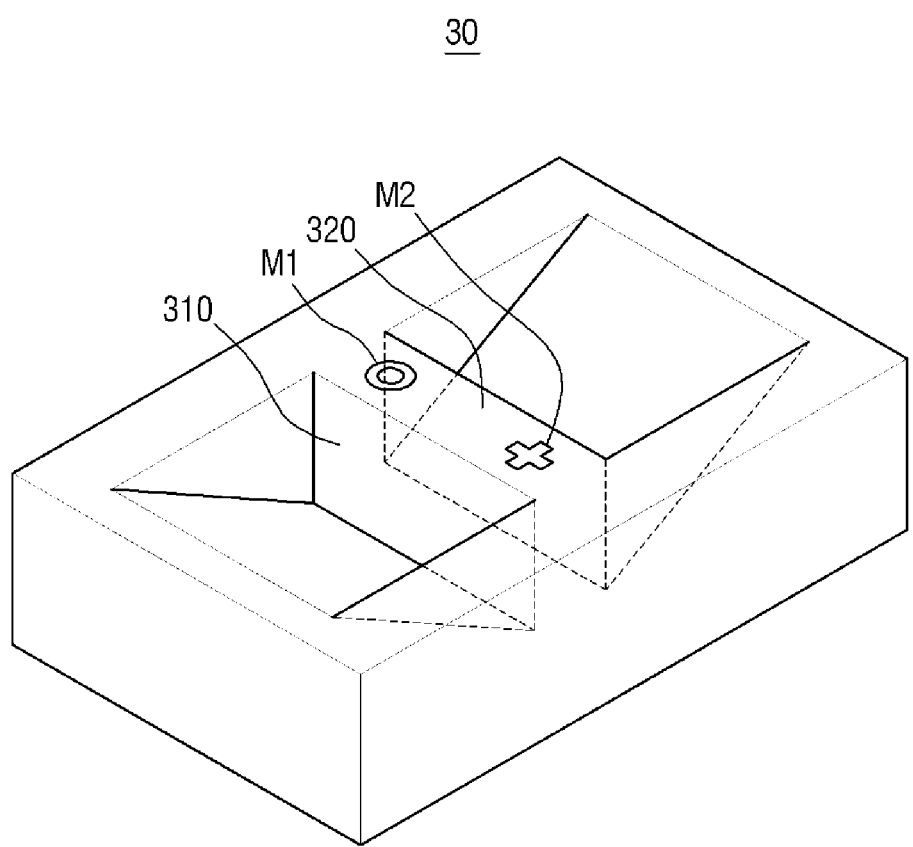
FIG. 5 is a diagram illustrating a process of forming an analysis region for a target place for inspecting a semiconductor device according to be example embodiment.

FIG. 5 illustrates an analysis region 31 formed as a result of performing the process described in FIGS. 3 and 4.

Figure 6:
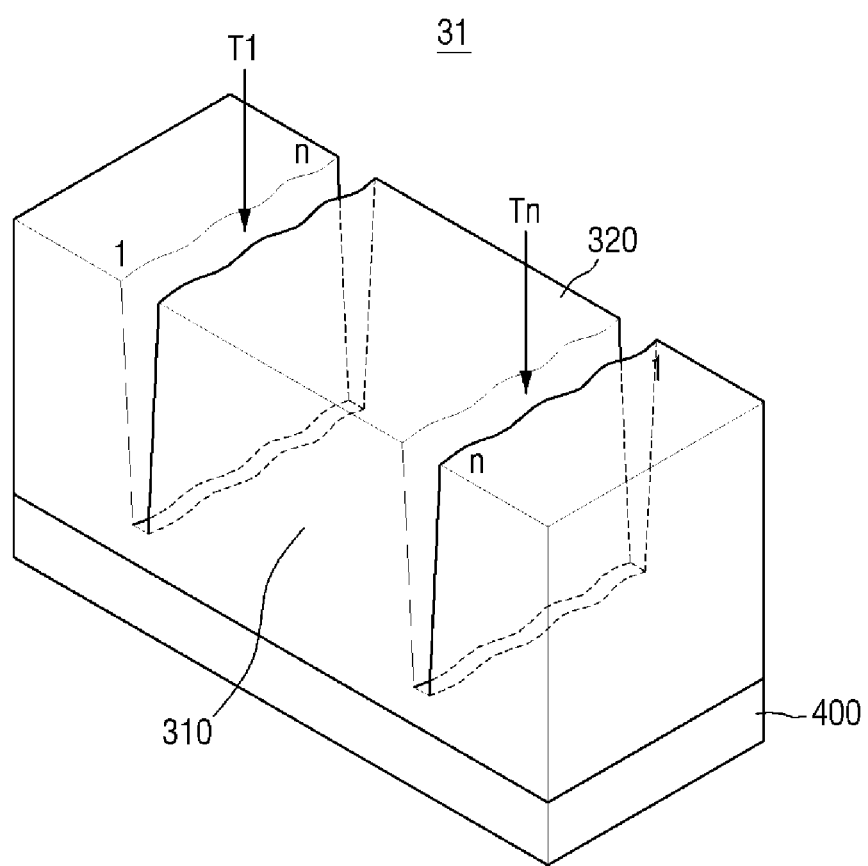
FIG. 6 is a diagram illustrating a process of analyzing deep trenches from an analysis region for inspecting a semiconductor device according to an example embodiment.

FIG. 6 is a diagram illustrating a process of analyzing deep trenches from an analysis region formed for inspecting a semiconductor device according to an example embodiment.

Referring to FIG. 6, an analysis region 31 formed according to the method of inspecting a semiconductor device according to the example embodiment may include one or more deep trenches T1 and Tn, and a substrate 400 (e.g., a silicon substrate) may be disposed under a region (e.g., a mold region) where the deep trenches T1 and Tn are formed.

The computing system 20 according to the example embodiment may analyze the degree of bending of the deep trenches T1 and Tn based on the first image data and the second image data received from the device 10 for inspecting a semiconductor device, and determine whether a structure of fine patterns of a semiconductor device meets process conditions for manufacturing a semiconductor device and/or other conditions for producing a semiconductor device.

The analysis region 31 includes the first cut surface 310 and the second cut surface 320 as described above with reference to FIGS. 3 through 5.

One or more deep trenches T1 through Tn shown in the first cut surface 310 may be indexed, for example, from left to right as illustrated in FIG. 6. In this case, the index number of a leftmost deep trench may be 1, and the index number of a rightmost deep trench may be n (where n is a natural number).

Further, one or more deep trenches T1 through Tn shown in the second cut surface 320 may be indexed, for example, from right to left as illustrated in FIG. 6. In this case, the index number of a rightmost deep trench may be 1, and the index number of a leftmost deep trench may be n (where n is a natural number).

As will be described later with reference to FIGS. 7 and 8, in the method of inspecting a semiconductor device according to the example embodiment, values measured in cross-sections of the deep trenches T1 through Tn shown in the first cut surface 310 and values measured in cross-sections of the deep trenches T1 through Tn shown in the second cut surface 320 may be used together to determine suitability. For this operation, the index numbers of the deep trenches T1 through Tn shown in the first cut surface 310 and the index numbers of the deep trenches T1 through Tn shown in the second cut surface 320 may be matched to each other in reverse order.

That is, the cross-section of the deep trench whose index number is 1 in the first cut surface 310 may be matched with the cross-section of the deep trench whose index number in the second cut surface 320, and the cross-section of the deep trench whose index number is n in the first cut surface 310 may be matched with the second cross-section of the deep trench whose index number is 1 in the second cut surface 320.

In the method of inspecting a semiconductor device according to the example embodiment, after index matching is performed as described above, a first critical dimension (CD) value and a second CD value for each of the deep trenches T1 through Tn may be obtained from the first image data and the second image data.

The computing system 20 according to the example embodiment may analyze the degree of bending of the deep trenches T1 through Tn based on the first and second CD values received from the inspection device 10, and determine whether the structure of the fine patterns of the semiconductor device meet the process conditions for manufacturing a semiconductor device and/or other conditions for producing a semiconductor device.

Figure 7:
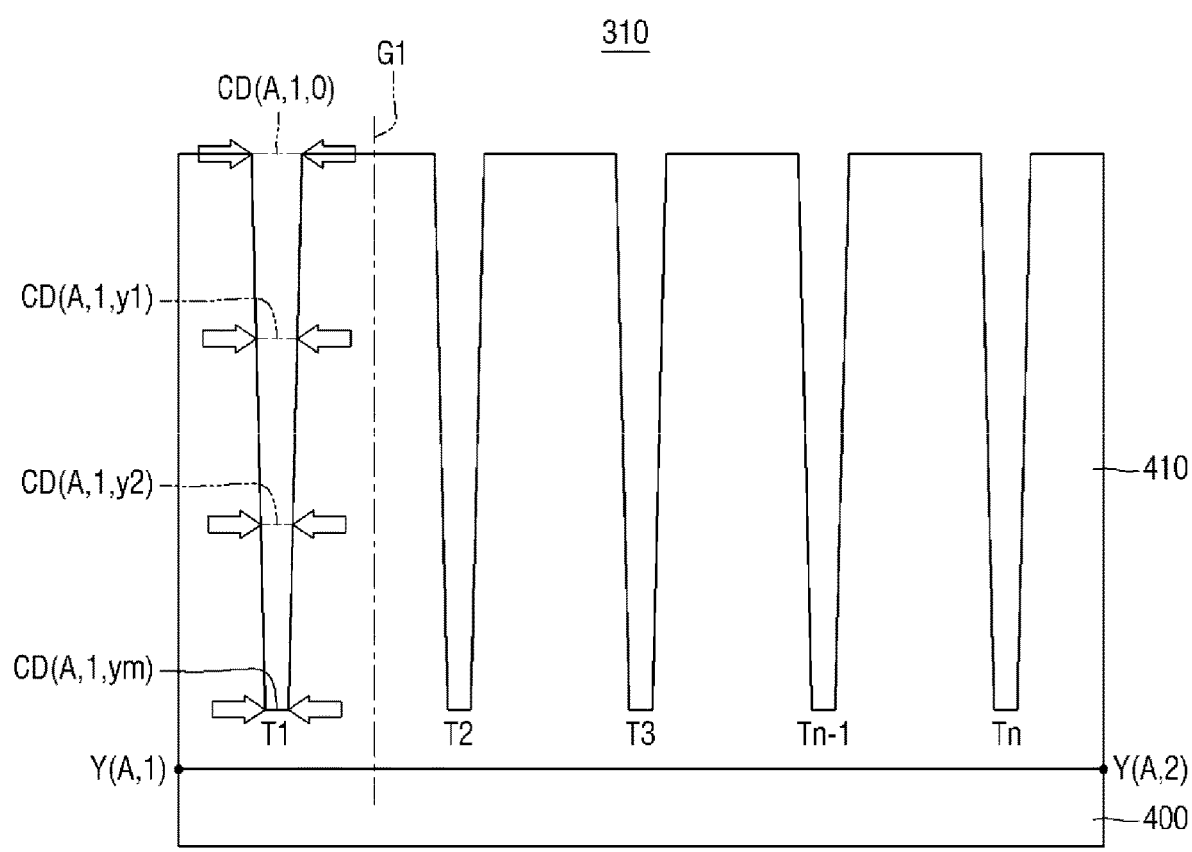
FIG. 7 is a diagram illustrating a process of analyzing deep trenches from an analysis region for inspecting a semiconductor device according to an example embodiment.

FIG. 7 is a diagram illustrating a process of analyzing deep trenches from an analysis region for inspecting a semiconductor device according to an example embodiment.

Referring to FIG. 7, the method of inspecting a semiconductor device according to the example embodiment includes CD values for widths of the first trench T1, which is disposed in a first mold cross-section 410 on the substrate 400 in the first cut surface 310, in a first-axis direction, for example, an X-axis direction in the Cartesian Coordinate (or alternatively, a horizontal direction).

For example, in the method, CD values CD(A, 1, 0), CD(A, 1, y1), CD(A, 1, y2) and CD(A, 1, ym) may be respectively obtained as widths of the first deep trench T1. The first deep trench T1 is a trench located between a left edge of the first mold cross-section 410 and an imaginary line G1 in the X-axis direction. The widths of the first deep trench T1 are trench widths at various heights 0, y1, y2, and ym (where m is a natural number) in a second-axis direction, for example, a Y-axis direction in the Cartesian Coordinate (or alternatively, a vertical direction or a depth direction of the deep trench).

Next, in the method, the position of a center point of CD(A, 1, 0), which is a width of the first deep trench T1 at the top of the first mold section 410, may be obtained. The position of the center point of CD (A, 1, 0) may be used as a basis for measuring relative displacements of CD(A, 1, y1), CD(A, 1, y2), and CD(A, 1, ym) in the X-axis direction.

That is, the difference in displacement in the X-axis direction between the position of a center point of CD(A, 1, y1) and the position of the center point of CD(A, 1, 0) may be measured to determine how much the center point of CD(A, 1, y1) is deviated from the center point of CD(A, 1, 0). Further, the difference in displacement in the X-axis direction between the position of a center point of CD(A, 1, y2) and the position of the center point of CD(A, 1, 0) may be measured to determine how much the center point of CD(A, 1, y2) is deviated from the center point of CD(A, 1, 0). By repeating this process, the degree of bending of the first deep trench T1 may be measured.

In some example embodiments, the method of inspecting a semiconductor device may further include performing rotation correction on the first age data by measuring the positions of two poi the first image data in the second-axis direction, for example, the Y-axis direction before obtaining CD values for widths in the first-axis direction.

For example, in the method, a height of a position Y(A, 1) in the Y-axis direction and a height of a position Y(A, 2) in the Y-axis direction may be measured. If there is a difference in height between the two positions, rotation correction may be performed on the first image data of the first cut surface 310. To determine whether there is a difference in height, the height value of the position Y(A, 2) in the Y-axis direction may be subtracted from the height value of the position Y(A, 1) in the Y-axis direction, and then it may be determined whether the subtraction result is zero. However, the scope of example embodiments is not limited to this method.

Figure 8:
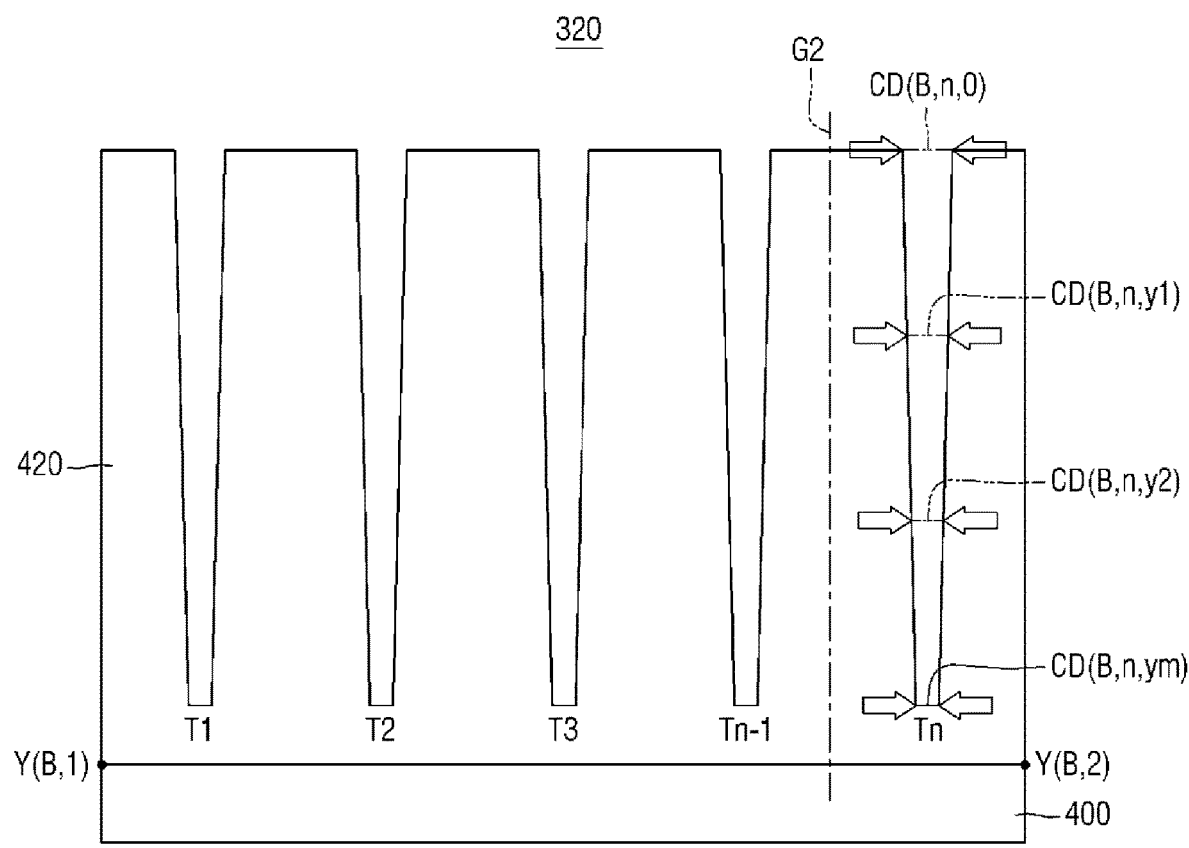
FIG. 8 is a diagram illustrating a process of analyzing deep trenches from an analysis region for inspecting a semiconductor device according to an example embodiment.

FIG. 8 is a diagram illustrating a process of analyzing deep trenches from an analysis region formed for inspecting a semiconductor device according to an example embodiment.

Referring to FIG. 8, the method of inspecting a semiconductor device according to the example embodiment includes obtaining CD values for widths of the $n^{th}$ trench Tn, which is disposed in a second mold cross-section 420 on the substrate 400 in the second cut surface 320, in the first-axis direction, for example, the X-axis direction. Here, the CD values for the cross-section of the $n^{th}$ trench Tn of FIG. 8 may be obtained because the $n^{th}$ trench Tn is index-matched to the first trench T1 in the first mold cross-section 410 on the substrate 400 in the first cut surface 310 as described above with reference to FIGS. 6 and 7.

For example, in the method, CD values CD(B, n, 0), CD(B, n, y1), CD(B, n, y2) and CD(B, n, ym) may be respectively obtained as widths of the $n^{th}$ deep trench Tn. The $n^{th}$ deep trench Tn is a trench located between an imaginary line G2 and a right edge of the second mold cross-section 420. The widths of the $n^{th}$ deep trench Tn are trench widths in the X-axis direction at various heights 0, y1, y2 and ym (where in is a natural number) in the second-axis direction, for example, the Y-axis direction.

Next, in the method, the position of a center point of CD(B, n, 0), which is a width of the $n^{th}$ deep trench Tn at the top of the second mold section 420, may be obtained. The position of the center point of CD(B, n, 0) may be used as a basis for measuring relative displacements of CD(B, n, y1), CD(B, n, y2), and CD(B, n, ym) in the X-axis direction.

That is, the difference in displacement in the X-axis direction between the position of a center point of CD(B, n, y1) and the position of the center point of CD(B, n, 0) may be measured to determine how much the center point of CD(B, n, y1) is deviated from the center point of CD(B, n, 0). Further, the difference in displacement in the X-axis direction between the position of a center point of CD(B, n, y2) and the position of the center point of CD(B, n, 0) may be measured to determine how much the center point of CD(B, n, y2) is deviated from the center point of CD(B, n, 0). By repeating this process, the degree of bending of the $n^{th}$ deep trench Tn may be measured.

In some example embodiments, the method of inspecting a semiconductor device may further include performing rotation correction on the second image data by measuring the positions of two points in the second image data in the second-axis direction, for example, the Y-axis direction before obtaining CD values for widths in the first-axis direction.

For example, in the method, a height of a position Y(B, 1) in the Y-axis direction and a height of a position Y(B, 2) in the Y-axis direction may be measured. If there is a difference in height between the two positions, rotation correction may be performed on the second age data of the second cut surface 320. To determine whether there is a difference in height, the height value of the position Y(B, 2) in the Y-axis direction may be subtracted from the height value of the position Y(B, 1) in the Y-axis direction, and then it may be determined whether the subtraction result is zero. However, the scope of example embodiments is not limited to this method.

As described above, after the dimensions of fine patterns of a semiconductor device are measured, differences in displacement from a reference center point in the first-axis direction, for example, the X-axis direction may be measured. Therefore, it may be possible to precisely determine whether the structure of the fine patterns f the semiconductor device meets process conditions for manufacturing a semiconductor device and/or other conditions for producing a semiconductor device. Further, it may be possible to secure a stable sample for the structure analysis of fine patterns in, for example, deep trenches formed in a V-NAMD memory cell and/or to minimize errors that occur in samples.

In some example embodiments, the degree of bending of a deep trench may be analyzed based on the average of a CD value for a width of a cross-section of the deep trench in the first cut surface 310 in the first-axis direction and a CD value for a width of a cross-section of the deep trench in the second cut surface 320 in the first-axis direction. This will be described in detail later with reference to FIG. 10.

Figure 9:
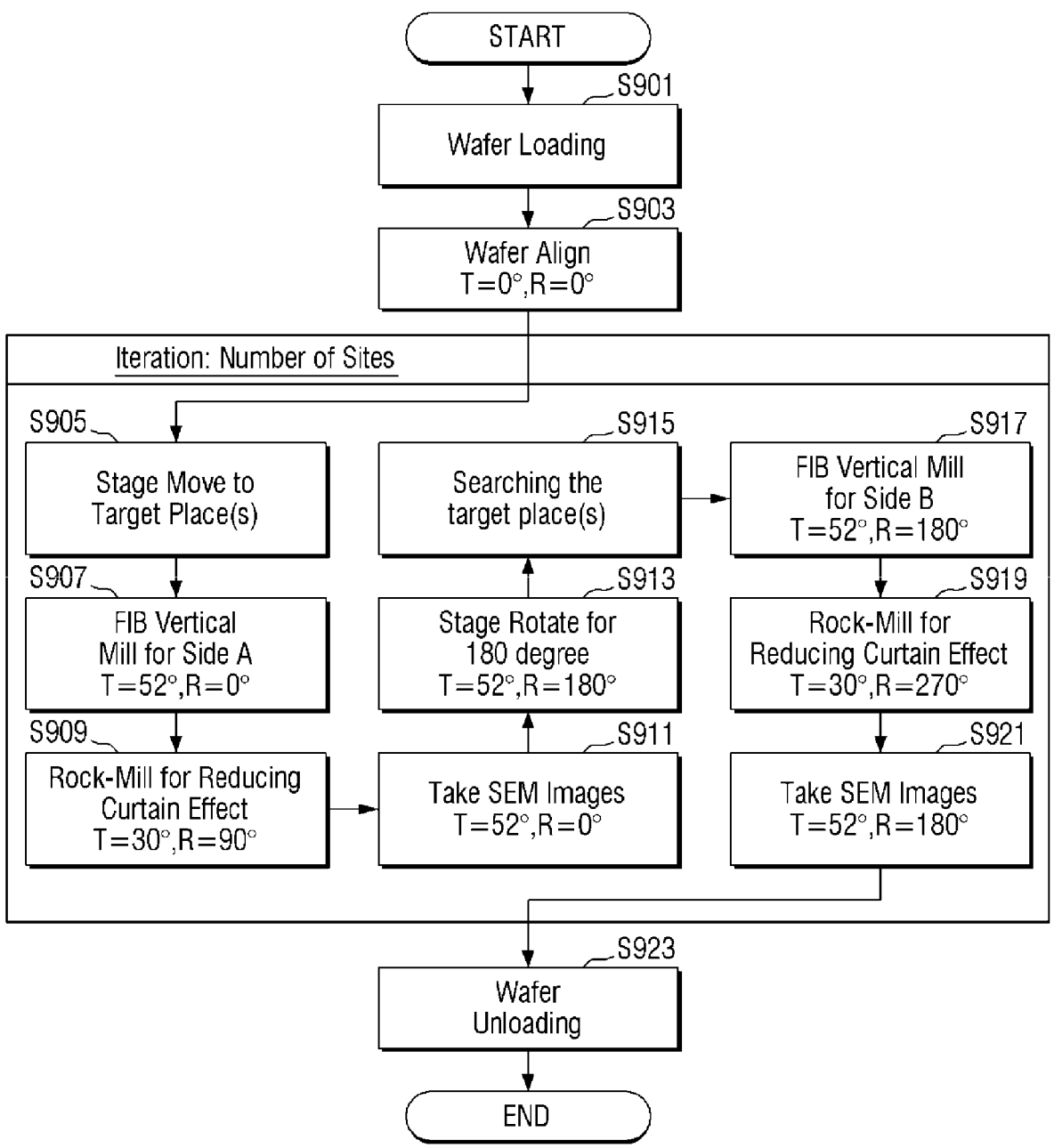
FIG. 9 is a flowchart illustrating a method of inspecting a semiconductor device according to an example embodiment.

FIG. 9 is a flowchart illustrating a method of inspecting a semiconductor device according to an example embodiment.

Referring to FIG. 9, in the method of inspecting a semiconductor device according to the example embodiment, a wafer 100 is loaded onto the stage 110 (operation S901), and then the loaded wafer 100 is aligned (operation S903).

Next, the stage 110 may be moved (operation S905) to inspect a target place 30 on the wafer 100. For example, the stage 110 may be horizontally moved to inspect the target place 30 on the wafer 100.

Next, after the tilting angle is set to, for example, 52 degrees, first milling VM1 (FIB vertical milling) is performed on the target place 30 in a first direction (operation S907). Then, rock-milling is performed on the target place 30 in a third direction that is rotated with respect to the first direction by a first angle (e.g., 90 degrees) (operation S909). During the rock-milling, the tilting angle may be set to, for example, 30 degrees.

Next, the stage 110 may be rotated in reverse by the first angle, for example, 90 degrees, and then SEM image data of a first cut surface 310 may be obtained in the first direction (operation S911). Here, the tilting angle may be set again to, for example, 52 degrees.

Next, the wafer 100 may be rotated by 180 degrees (operation S913).

Then, the stage 110 may be moved (operation S915) to inspect the target place 30 on the wafer 100.

Next, second milling VM2 (FIB vertical milling) is performed on the target place 30 in a second direction (operation S917) while the tilting angle is maintained at, for example, 52 degrees. Then, rock-milling is performed on the target place 30 in a fourth direction that is rotated with respect to the second direction by the first angle (e.g., 90 degrees) (operation S919). During the rock-milling, the tilting angle may be set to, for example, 30 degrees.

Next, the stage 110 may be rotated in reverse by the first angle, for example, 90 degrees, and then SEM image data of a second cut surface 320 may be obtained in the second direction (operation S921). Here, the tilting angle may be set again to, for example, 52 degrees.

Next, the wafer 100 may be unloaded (operation S923), and then first image data of the first cut surface 310 and second image data of the second cut surface 320 obtained as described above may be transmitted to the computing system 20.

In the current example embodiment, operations S905 through S921 may be repeatedly performed on a plurality of target places 30 on the wafer 100.

Figure 10:
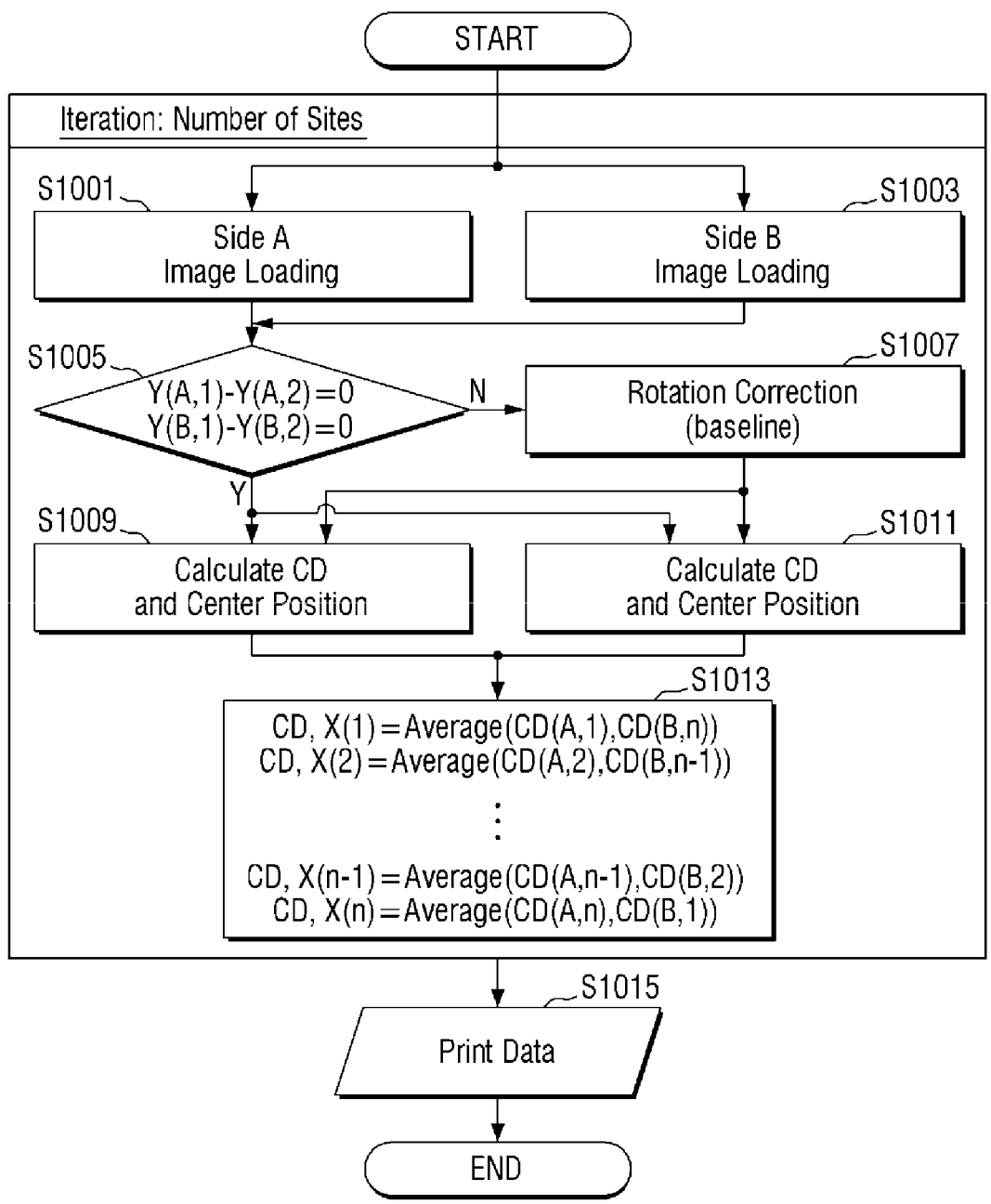
FIG. 10 is a flowchart illustrating a method of inspecting a semiconductor device according to an example embodiment.

FIG. 10 is a flowchart illustrating a method of inspecting a semiconductor device according to an example embodiment.

Referring to FIG. 10, in the method of inspecting a semiconductor device according to the example embodiment, a side A image corresponding to the first cut surface 310 such as the one illustrated in FIG. 7 may be loaded (operation S1001), and a side B image corresponding to the second cut surface 320 such as the one illustrated in FIG. 8 may be loaded (operation S1003).

Next, it may be determined whether rotation correction is desired for the first image data and/or the second image data (operation S1005). If the rotation correction is desired (N in operation S1005), it is performed. To determine whether there is a difference in height, a height value of a position Y(A, 2) in an Y-axis direction may be subtracted from a height value of a position Y(A, 1) in the Y-axis direction, and then it may be determined whether the subtraction result is zero. Further, a height value of a position Y(B, 2) in the Y-axis direction may be subtracted from a height value of a position Y(B, 1) in the Y-axis direction, and then it may be determined whether the subtraction result is zero. However, the scope of example embodiments is not limited to this method.

If the rotation correction is not desired (Y in operation S1005) or after the rotation correction is performed (operation S1007), CD values for widths of a cross-section of a trench, which is disposed in a first mold cross-section 410 on a substrate 400 in the first cut surface 310, in a first-axis direction, for example, an X-axis direction may be obtained, and positions of center points of the widths of the cross-section of the trench may be calculated (operation S1009), as described in FIG. 7. Further, CD values for widths of a cross-section of the trench, which is disposed in a second mold cross-section 420 on the substrate 400 in the second cut surface 320, in the first-axis direction, for example, the X-axis direction may be obtained, and positions of center points of the widths of the cross-section of the trench may be calculated (operation S1011), as described in FIG. 8.

Next, the degree of bending of the deep trench is analyzed based on an average value of the CD values for the widths of the cross-section of the deep trench in the first cut surface 310 in the first-axis direction and an average of the CD values for the widths of the cross-section of the deep trench in the second cut surface 320 in the first-axis direction (operation S1013).

For example, the average of CD values CD(A, 1) of a first trench T1 from the left side of the first cut surface 310 and CD values CD(B, n) of an $n^{th}$ trench from the left side of the second cut surface 320 may be calculated to calculate a center point of the trench T1, and the average of CD values CD(A, 2) of a second trench T2 from the left side of the first cut surface 310 and a CD value CD(B, n−1) of an $(n-1)^{th}$ trench from the left side of the second cut surface 320 may be calculated to calculate a center point of the trench T2. Although not specifically illustrated in FIG. 10, calculating a center point based on the average of CD values may be performed for various heights 0, y1, y2 and ym (where in is a natural number) in the Y-axis direction as described in FIGS. 7 and 8.

Next, the analysis result may be output, for example, printed (operation S1015). In the current example embodiment, the analysis result may include data providing a conclusion that enables determination about the degree of bending of a deep trench or may simply include values of displacement differences of the positions of center points in the X-axis direction at various heights of a plurality of deep trenches.

In the current example embodiment, operations S1001 through S1015 may be repeatedly performed on a plurality of target places 30 on the wafer 100.

According to the various example embodiments described above, after the dimensions of fine patterns of a semiconductor device are measured, differences in displacement from a reference center point in the first-axis direction, for example, the X-axis direction may be measured. Therefore, it may be possible to precisely determine whether the structure of the fine patterns of the semiconductor device meets process conditions for manufacturing a semiconductor device and/or other conditions for producing a semiconductor device. Further, it may be possible to secure a stable sample for the structure analysis of fine patterns in, for example, deep trenches formed in a V-NAMD memory cell and/or to minimize errors that occur in samples.

In concluding the detailed description, those skilled in the art will appreciate that many variations and modifications can be made to the disclosed example embodiments without substantially departing from the principles of the present disclosure. Therefore, the disclosed example embodiments of the disclosure are used in a generic and descriptive sense only and not for purposes of limitations.

What is claimed is:

1. A method of inspecting a semiconductor device, the method comprising:
    setting at least one target place on a wafer, the target place including at least one deep trench;
    forming a first cut surface by performing first milling on the target place in a first direction;
    obtaining first image data of the first cut surface;
    forming a second cut surface by performing second milling on the target place in a second direction opposite to the first direction;
    obtaining second image data of the second cut surface;
    obtaining a plurality of first critical dimension (CD) values for the deep trench from the first image data;
    obtaining a plurality of second CD values for the deep trench from the second image data;
    analyzing a degree of bending of the deep trench based on the plurality of first CD values and the plurality of second CD values; and
    providing the semiconductor device meeting a condition based on results of the analyzing.

2. The method of claim 1, further comprising:
    performing rock-milling in a third direction, which is at a certain angle to the first direction, subsequent the forming a first cut surface.

3. The method of claim 1, wherein the obtaining first image data comprises obtaining a scanning electron microscope (SEM) image of the first cut surface in the first direction.

4. The method of claim 1, wherein the forming a second cut surface comprises rotating the wafer by 180 degrees.

5. The method of claim 1, further comprising:
    performing rock-milling in a fourth direction, which is at a certain angle to the second direction, subsequent to the forming a second cut surface.

6. The method of claim 1, wherein the obtaining second image data comprises obtaining an SEM image of the second cut surface in the second direction.

7. The method of claim 1, further comprising:
    performing rotation correction on the first image data by measuring positions of two points in the first image data in a vertical direction, the vertical direction being a depth direction of the deep trench; and
    performing rotation correction on the second image data by measuring positions of two points in the second image data in the vertical direction.

8. The method of claim 1, wherein
    the obtaining a plurality of first CD values comprises obtaining a CD value for a width of a cross-section of the deep trench in the first cut surface in a first-axis direction, and
    the obtaining a plurality of second CD values comprises obtaining a CD value for a width of a cross-section of the deep trench in the second cut surface in the first-axis direction.

9. The method of claim 8, wherein
    the obtaining a plurality of first CD values further comprises obtaining a position of a first center point of the cross-section of the deep trench in the first cut surface in the first-axis direction, and the obtaining a plurality of second CD values further comprises obtaining a position of a second center point of the cross-section of the deep trench in the second cut surface in the first-axis direction.

10. The method of claim 8, wherein the analyzing a degree of bending of the deep trench comprises analyzing the degree of bending of the deep trench based on an average value of the CD value for the width of the cross-section of the deep trench in the first cut surface in the first-axis direction and the CD value for the width of the cross-section of the deep trench in the second cut surface in the first-axis direction.

11. A method of inspecting a semiconductor device, the method comprising:
loading a wafer onto a stage of an inspection device, the wafer including at least one deep trench;
forming a first cut surface by performing first milling on the wafer in a first direction;
first-rotating the stage by a first angle subsequent to the forming a first cut surface;
performing rock-milling in a second direction, the second direction being at an angle to the first direction, subsequent to first-rotating the stage;
obtaining first image data by taking an SEM photograph of the first cut surface in the first direction;
second-rotating the stage by 180 degrees;
forming a second cut surface by performing second milling in a third direction opposite to the first direction subsequent to the second-rotating the stage;
performing rock-milling in a fourth direction, the fourth direction being at an angle to the third direction, subsequent to the second-rotating the stage;
obtaining second image data by taking an SEM photograph of the second cut surface in the third direction;
analyzing a degree of bending of the deep trench based on the first image data and the second image data; and
providing the semiconductor device meeting a condition based on results of the analyzing.

12. The method of claim 11, further comprising:
obtaining a plurality of first CD values for the deep trench from the first image data; and
obtaining a plurality of second CD values for the deep trench from the second image data,
wherein the analyzing a degree of bending of the deep trench comprises analyzing the degree of bending of the deep trench based on the plurality of first CD values and the plurality of second CD values.

13. The method of claim 12, wherein
the obtaining a plurality of first CD values comprises obtaining a CD value for a width of a cross-section of the deep trench in the first cut surface in a horizontal direction, the horizontal direction being a direction perpendicular to a depth direction of the deep trench, and
the obtaining a plurality of second CD values comprises obtaining a CD value for a width of a cross-section of the deep trench in the second cut surface in the horizontal direction.

14. The method of claim 13, wherein
the obtaining a plurality of first CD values further comprises obtaining a position of a first center point of the cross-section of the deep trench in the first cut surface in the horizontal direction, and the obtaining a plurality of second CD values further comprises obtaining a position of a second center point of the cross-section of the deep trench in the second cut surface in the horizontal direction.

15. The method of claim 12, further comprising:
performing rotation correction on the first image data by measuring positions of two points in the first image data in a depth direction of the deep trench; and
performing rotation correction on the second image data by measuring positions of two points in the second image data in the depth direction of the deep trench.

16. The method of claim 12, wherein the analyzing a degree of bending of the deep trench comprises analyzing the degree of bending of the deep trench based on one or more first CD values, from among the plurality of the first CD values, corresponding to widths of a cross-section of the deep trench in the first cut surface and one or more second CD values, from among the plurality of the second CD values, corresponding to widths of a cross-section of the deep trench in the second cut surface.

17. A method of inspecting a semiconductor device, the method comprising:
setting at least one target place on a wafer, the target place including at least one deep trench;
obtaining first image data of a first cut surface of the target place in a first direction;
obtaining second image data of a second cut surface of the target place in a second direction, the second direction being opposite to the first direction;
obtaining a first CD value for a width of a cross-section of the deep trench in the first cut surface and a position of a first center point of the cross-section of the deep trench in the first cut surface, the first CD value and the position of the first center point being values measured in a horizontal direction that is perpendicular to a depth direction of the deep trench;
obtaining a second CD value for a width of a cross-section of the deep trench in the second cut surface and a position of a second center point of the cross-section of the deep trench in the second cut surface, the second CD value and the position of the second center point being values measured in the horizontal direction;
analyzing a degree of bending of the deep trench based on the first CD value, the second CD value; and
providing the semiconductor device meeting a condition based on results of the analyzing.

18. The method of claim 17, further comprising:
rotating the wafer by 180 degrees immediately prior to obtaining the second image data.

19. The method of claim 17, further comprising:
performing rotation correction on the first image data by measuring positions of two points in the first image data in a vertical direction, the vertical direction being perpendicular to the horizontal direction; and
performing rotation correction on the second image data by measuring positions of two points in the second image data in the vertical direction.

20. The method of claim 17, wherein the analyzing a degree of bending of the deep trench comprises analyzing the degree of bending of the deep trench based on an average value of the first CD value and the second CD value.

* * * * *